United States Patent [19]

Beardow

[11] Patent Number: 4,701,251

[45] Date of Patent: Oct. 20, 1987

[54] APPARATUS FOR SPUTTER COATING DISCS

[75] Inventor: Terence Beardow, Endenfield, England

[73] Assignee: BVT Limited, Manchester, England

[21] Appl. No.: 825,210

[22] Filed: Feb. 3, 1986

[51] Int. Cl.[4] ............................................. C23C 14/34
[52] U.S. Cl. .................................. 204/298; 414/217; 414/222
[58] Field of Search ............... 204/192 R, 298, 192.1, 204/192.12; 118/718, 719, 729, 733; 198/339, 345; 414/217, 225, 222, 226

[56] References Cited

U.S. PATENT DOCUMENTS

| | | | |
|---|---|---|---|
| 3,294,670 | 12/1966 | Charschan et al. | 204/298 |
| 3,521,765 | 7/1970 | Kaufman et al. | 204/298 X |
| 4,260,466 | 4/1981 | Shirahata et al. | 204/192 M |
| 4,417,968 | 11/1983 | McKelvey | 204/298 X |
| 4,422,916 | 12/1983 | McKelvey | 204/298 X |
| 4,485,911 | 12/1984 | Cameron | 198/345 |
| 4,500,407 | 2/1985 | Boys et al. | 204/298 |
| 4,558,388 | 12/1985 | Graves, Jr. | 204/298 X |
| 4,595,483 | 6/1986 | Mahler | 204/192 R X |

Primary Examiner—John F. Niebling
Assistant Examiner—Nam X. Nguyen
Attorney, Agent, or Firm—Bert J. Lewen; Henry Sternberg

[57] ABSTRACT

Apparatus for sputter coating a disc comprises an evacuable chamber with a disc entry and exit opening. A disc to be coated is supported at the center of the disc by support means and drive means move the support means along a disc path between a disc loading position outside the chamber and a disc coating position within the chamber. Inside the chamber are two pivotally mounted cathodes each having coating material to be sputtered applied to a surface thereof. The cathodes are mounted to pivot between the withdrawn position lying clear of the disc path and operating position wherein the cathodes lie one to each side of the disc when this is in the coating position. Means are provided for rotating the support means and thus the disc about the disc center when in the coating position and during such rotation coating material is sputtered from the cathodes simultaneously onto both sides of the disc.

10 Claims, 9 Drawing Figures

APPARATUS FOR SPUTTER COATING DISCS

BACKGROUND OF THE INVENTION

This invention relates broadly to apparatus for sputter coating a substrate in the form of a disc.

Cathode sputtering is now widely used for depositing thin films of material onto substrates of many different configurations. The process generally involves ion bombarding a target of the material to be sputtered in an ionised gas atmosphere in an evacuable coating chamber. Vacuum is maintained in the chamber to cause particles of the target material to be dislodged and deposited as a thin film on the substrate being coated.

The coating of discs, for example magnetic discs used for data storage, is one particular field where sputter coating may advantageously be used, and there have been proposals for apparatus specifically designed to be dedicated to disc coating. One such proposal is summarised in the Journal "Research And Development" for March 1985 in an article by Richard E. Levine at pages 111 to 116 of that Journal. In the apparatus there described, discs are individually loaded in a clean room onto a disc support which holds the disc around part of the circumference thereof. Means are provided for moving the support from the clean room through a sequence of process chambers wherein the disc is cleaned and required materials are sputtered onto the discs. In each coating chamber the disc is positioned between two opposed targets so that both sides of the disc may be coated simultaneously.

The principal difficulties that are experienced with this apparatus stem from the method by which the disc is supported. The circumferential support system disclosed makes it extremely difficult to achieve the necessary firm grip on the disc without obscuring a part of the disc that requires to be coated.

SUMMARY OF THE INVENTION

The present invention contemplates a new and novel form of apparatus for sputter coating discs which is significantly different from the apparatus heretofore proposed and which, while retaining the advantages of high deposition rates, avoids disc handling problems and improves the uniformity of deposition.

According to the invention, apparatus for sputter coating a substrate in the form of a disc comprises an evacuable chamber having a disc entry and exit opening, support means for supporting said disc at the centre thereof, drive means for driving said support means to move said disc along a disc path between a disc loading position outside said chamber and a disc coating position within said chamber, a pair of cathodes each having coating material to be sputtered applied to a surface thereof, pivot means mounting said cathodes within said chamber for pivotal movement between withdrawn positions lying clear of said disc path and operating positions wherein said cathodes lie one to each side of said disc when in said disc coating position, and rotary means for rotating said disc about the center thereof when in said disc coating position, whereby coating material may be sputtered simultaneously onto both sides of said disc as this is rotated in said disc coating position with said cathodes in said operating positions.

It will be seen that the invention utilises centre support for the disc throughout the processing method. There are many ways in which a disc may be securely supported at the centre thereof, and of course the centre region of the disc does not require coating as it is usually used purely for support purposes during end use of the disc. Apart from the center region, however, the whole of the remaining area of the disc is exposed to the targets as the disc rotates and the process may readily be controlled to ensure uniform deposition over the whole of that remaining area.

Although the apparatus may utilise any of a number of different types of cathode with associated target, it is particularly preferred that the cathode is enhanced by magnetic means associated therewith which establishes a zone along which the sputtering or erosion of the target material takes place. It is also particularly preferred if the cathodes each comprise a cylindrical tubular member having the target material applied as a layer to the outer surface thereof, the magnetic means being located radially within the tubular member, and the tubular member being capable of rotation about its longitudinal axis to bring different portions of the coating material into sputtering position opposite the magnetic means and within the sputtering zone. Particularly effective utilisation of target material may be achieved in this way.

Cathodes of this type are in themselves known, for example from U.S. Pat. No. 4,422,916 to Harold E. McKelvy, the entire contents of which are herein incorporated by reference.

The foregoing features and advantages of the invention, together with other features and advantages will be apparent from the following description, given with reference to the accompanying drawings.

DETAILED DESCRIPTION OF THE INVENTION

One form of the invention is illustrated in FIGS. 1 to 4 of the drawings, and is particularly suitable for the individual coating of single discs, for example in a laboratory application where different types and thicknesses of coating may be investigated.

The apparatus is mounted on a floor standing frame 1 and includes a loading assembly 2, a loading chamber 3 having an associated extraction system 4, a shutter valve assembly 5 between the loading chamber and the extraction system, a process chamber 6, again having an associated extraction system 7, and a further shutter valve assembly 8 between the loading chamber 3 and the process chamber 6.

The loading assembly comprises a front wall 10 having a circular opening therein, the wall having upper and lower hinge members 11 and 12 welded thereto at appropriate locations, the hinge members forming part of a hinge assembly 13 supported by upper and lower brackets 14, 15 from a side wall 16 of the loading chamber 3. The loading assembly can thus pivot about the hinge assembly relative to the loading chamber between the closed position shown in FIG. 1 and in full lines in FIG. 2, and the open position partially indicated by the broken lines in FIG. 2. When in the closed position the wall 10 of the loading assembly engages a corresponding wall 17 of the loading chamber 3, which wall has a circular opening coaxial with the opening in the wall 10. Sealing means, for example in the form of a sealing ring 18 surround the opening in wall 17, and the loading assembly may be held in the closed and sealed position by an upper locking member 19 and a similar lower locking member (not shown).

Welded to the front wall 10 is a base plate 20 and two spaced support brackets 21 which are also welded to the base plate. Two blocks 22 and 23 are secured by respective screws to the base plate 20 and two parallel guide rods 24, 25 extend between the blocks 22 and 23. The blocks each incorporate a bearing, the bearings rotatably supporting opposite ends of a shaft 26 having a hand wheel 27 at one end and a threaded center section 28 lying between the blocks. A carriage 29 is slidable along and guided by the guide rods 24, 25, the carriage having a threaded opening with which the threaded section 28 of the shaft 26 engages. Rotation of the hand wheel 27 is thus effective to move the carriage between a carriage retracted position shown as CR in FIG. 2 and a carriage advanced position shown as CA in that Figure.

A cylindrical housing 30 is secured, for example by welding, to the front wall 10 and mounted within the housing are bearings 31 and 32 which rotatably support a hollow shaft 33, one end of which extends outwardly from the housing. A pulley 34 is secured to rotate with that end of the shaft and can be driven by a belt 35 from a further pulley 36 driven through a suitable gear arrangement from an electric motor 37. The motor 37 is mounted on a support plate 38 secured by brackets 39 and 40 to the plate 10. The outer end of the hollow shaft 33 is formed with a dog tooth coupling section 41. A solid shaft 42 extends through the center of the hollow shaft 33 and carries at its inner end a disc holder 43. The outer end of the shaft 42 has a further dog tooth coupling section 44 secured to the shaft 42 by a pin and slot arrangement so that the section 44 is constrained to rotate with the shaft 42 but has some axial freedom relative thereto. A compression spring 45 acts to bias the section 44 away from an end plate 46 secured to rotate with the shaft 42 and having part of its circumference engaged between holding brackets 47 on the carriage 29.

Figure 1:
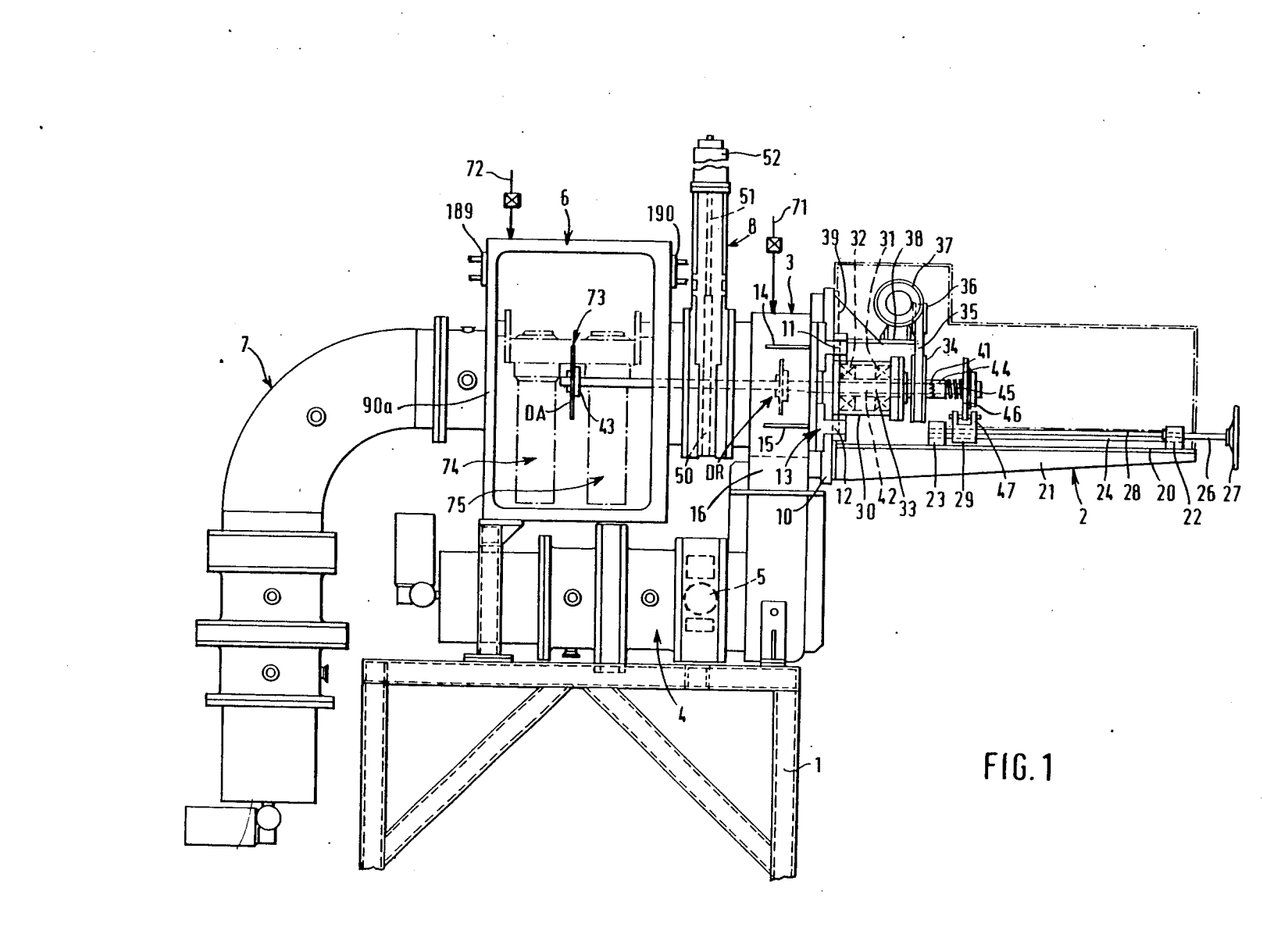
FIG. 1 is a side elevation of a first form of the apparatus, usable in the coating of individual discs.
Figure 2:
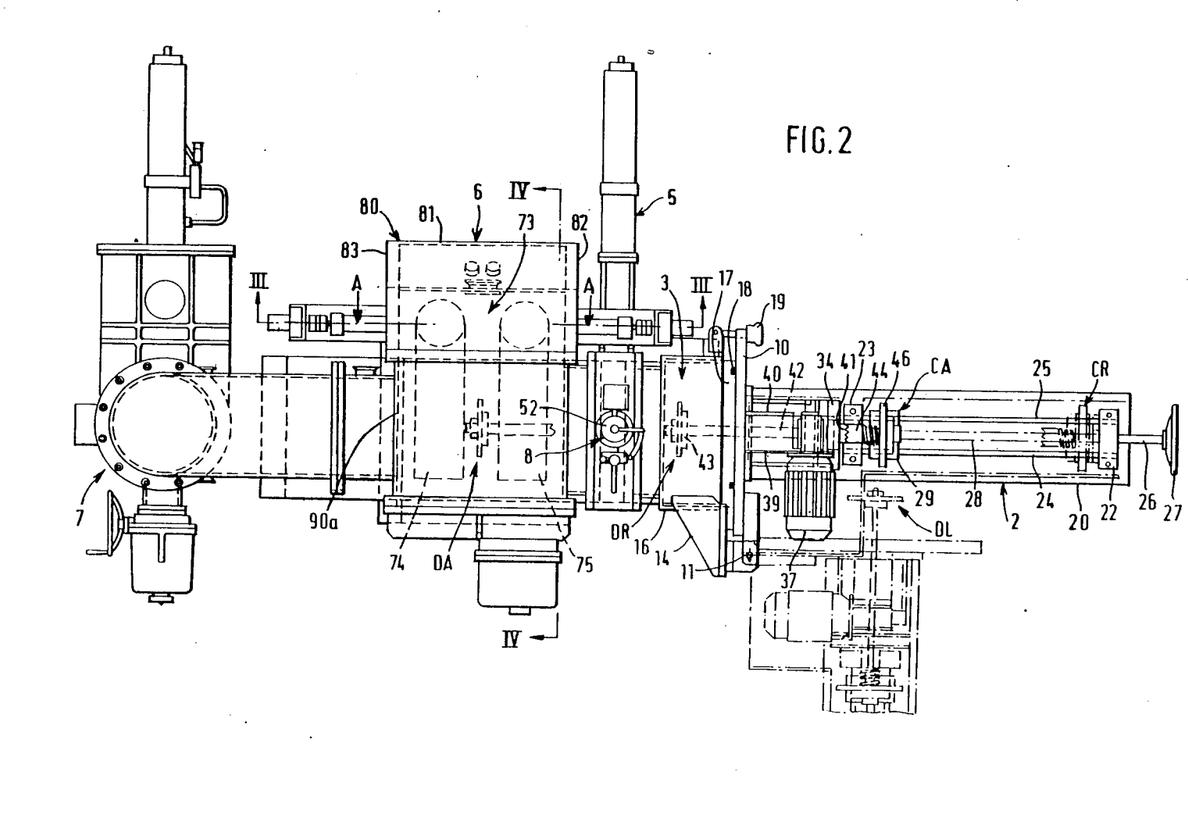
FIG. 2 is a plan view of the apparatus of FIG. 1.

It will be seen that when the carriage is in the retracted position CR the dog tooth sections 41 and 44 lie out of engagement with each other and the disc holder 43 is located in a disc retracted position DR shown in FIG. 2. When the carriage is in the advanced position CA the two dog tooth sections are in engagement as shown in FIGS. 1 and 2 and the disc holder 43 is moved to a disc advanced position DA. In this position, when the motor 37 is driven, that drive will be transmitted through the belt 35 and pulley 34 to the hollow shaft 33, and through the coupling members 41 and 44 to the solid shaft 42, so that shaft 42 and any disc held by the disc holder 43 will be rotated.

It has already been stated that the front of the loading chamber 3 is formed by a wall 17 with a circular opening therein. At its rear end, the chamber is closable by a shutter 50 of the shutter valve assembly 8, the shutter being carried by the piston 51 of a double-acting pneumatic ram 52 and movable relative to seals to either close or open the rear end of the chamber. Suitable shutter valve assemblies are well known in the art, one suitable example is the Series 12 Gate Valve sold by VAT Aktiengesellschaft fur Vakuum-Apparate-Technik, of CH-9469, Haag, Switzerland. The loading chamber 3 is connected by way of the shutter valve 5 to the vacuum extraction system 4, which incorporates a vacuum pump so enabling the chamber rapidly to be exhausted when the shutter 50 is closed, when the shutter valve 5 is opened and when the front wall 10 of the loading assembly is closed and sealed against the wall 17.

Figure 3A:
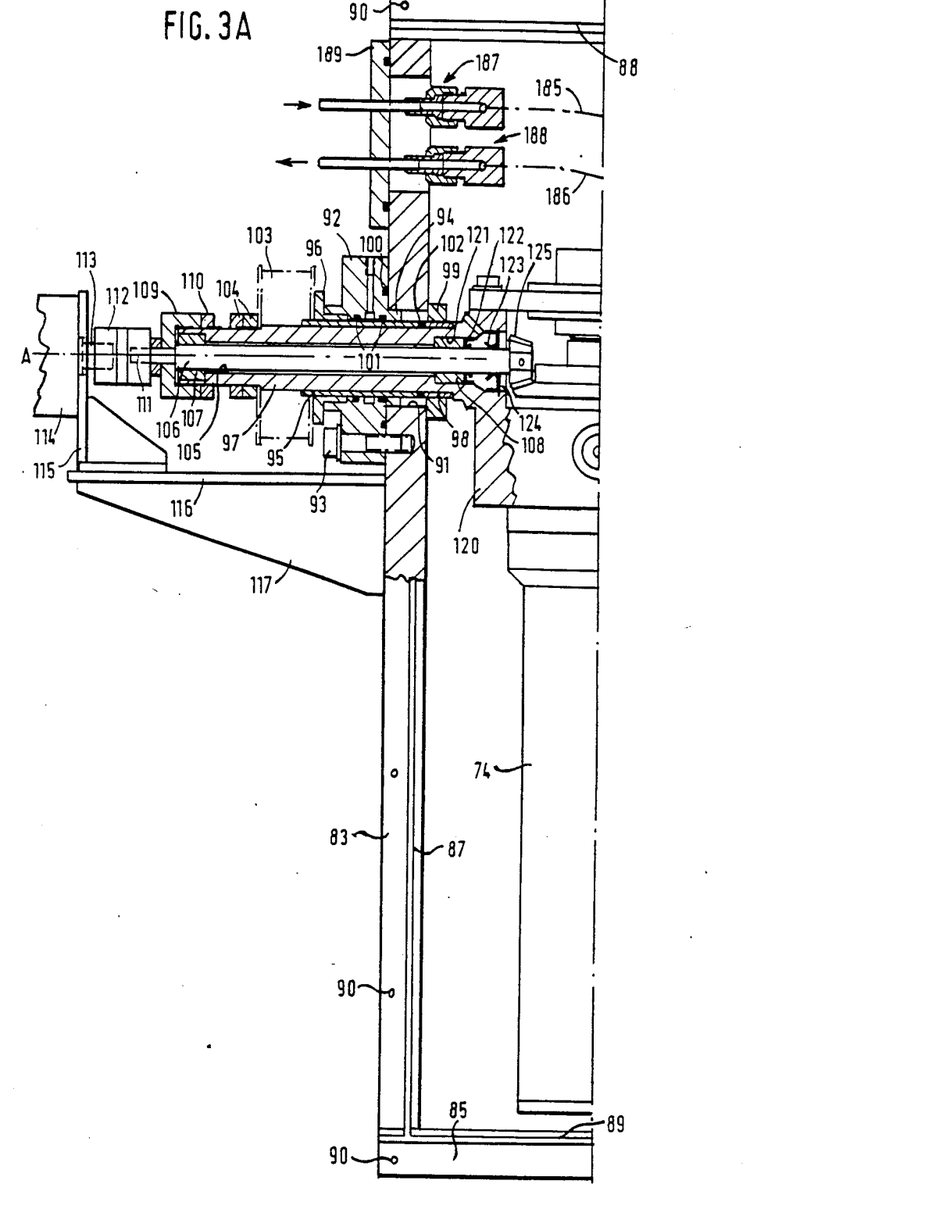
FIGS. 3A and 3B taken together are a section taken on the line III—III of FIG. 2.
Figure 3B:
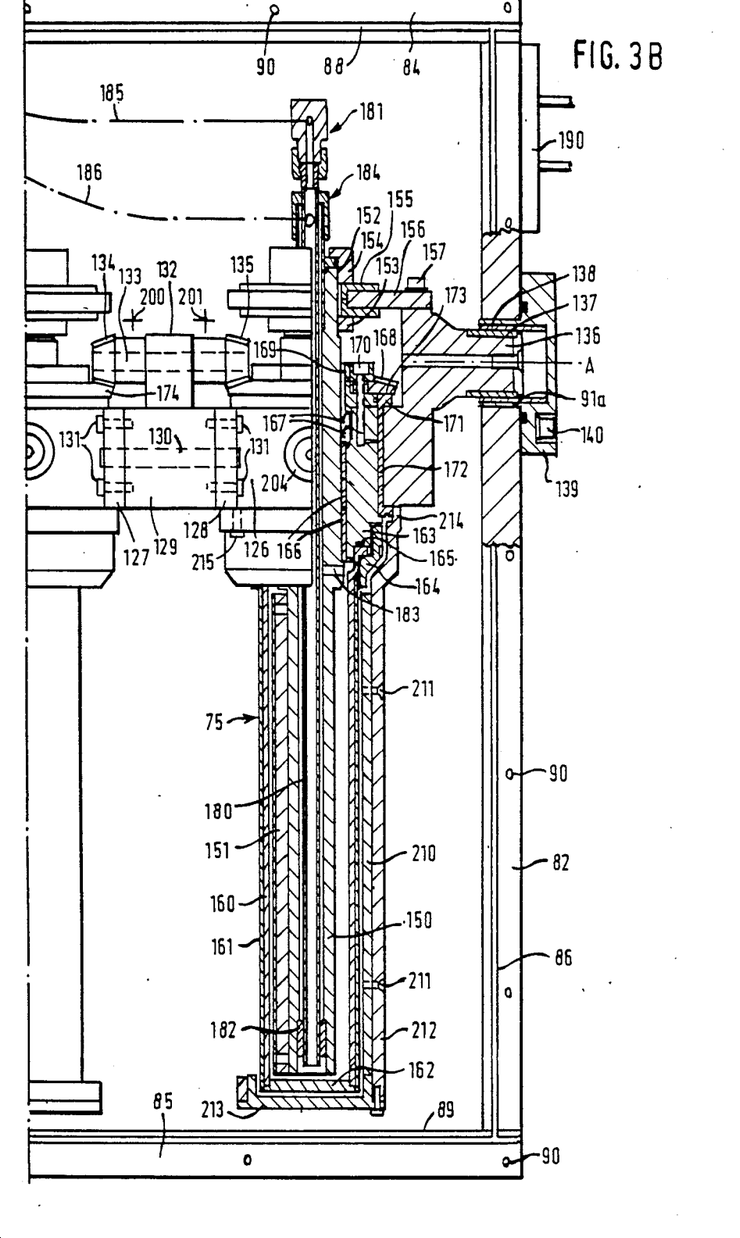
Figure 4:
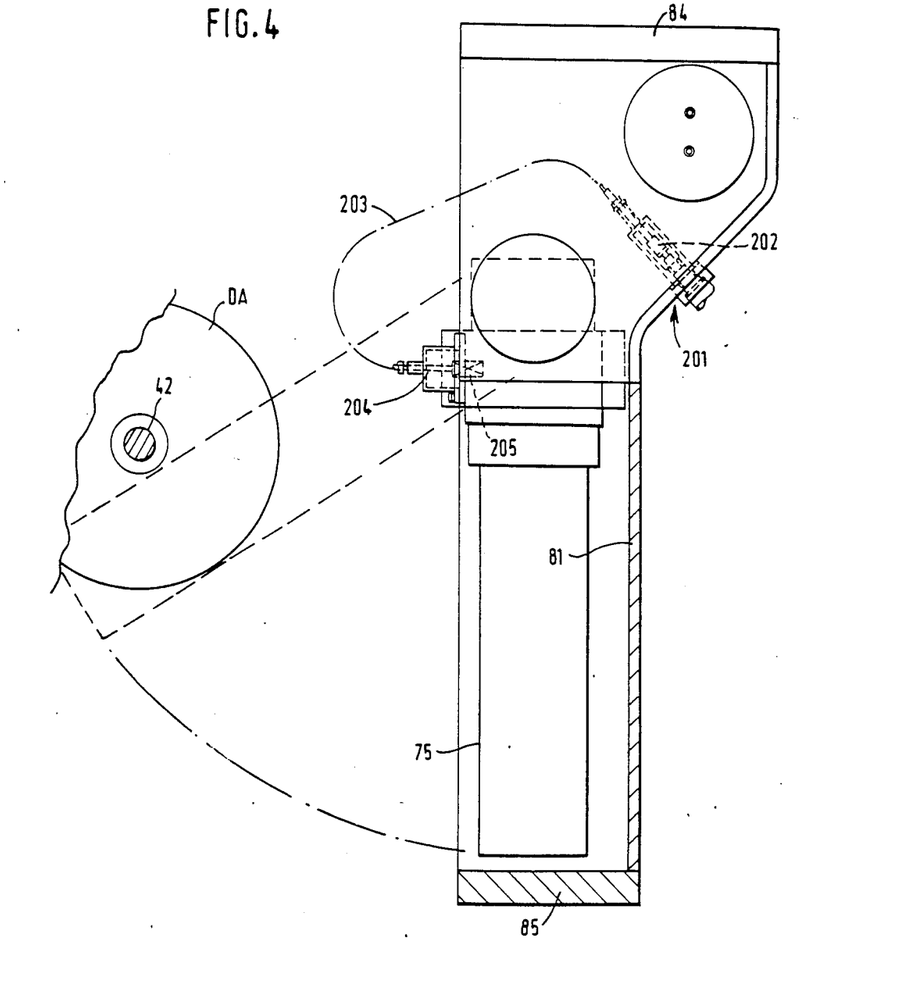
FIG. 4 is a partial cross-section on the line IV—IV of FIG. 2.

When the shutter valve 8 is in the closed position it seals off the loading chamber 3 from the processing chamber 6, and when in the open position it allows communication between the two chambers so that a disc mounted on the disc holder 43 may be moved from the disc retracted position DR to the disc advanced position DA, lying within the processing chamber. The processing chamber is connected to the vacuum system 7, which includes a vacuum pump in order that the chamber may be exhausted. Gas entry lines 71 and 72 for the gas to be ionised, usually an inert gas such as argon which may be in admixture with a reactive gas such as nitrogen, hydrogen or carbon, lead respectively into the loading chamber 3 and processing chamber 6 through appropriate control valves. The processing chamber 6 houses a cathode assembly 73 comprising two magnetically enhanced cylindrical cathodes 74 and 75, positioned with their axes parallel one to the other and mounted for common pivotal movement about pivot axis AA. The cathode assembly is shown in more detail in FIGS. 3 and 4, and will now be described.

The cathode assembly is mounted in a fabricated module 80 which comprises a rear wall 81, side walls 82 and 83 and top and bottom walls 84 and 85 respectively. The exposed edges of the side, top and bottom walls are each formed with a groove 86 to 89 respectively in which a sealing strip may be mounted, and those edges also have tapped holes such as 90 for receiving screws passed through flanges formed on mating walls of the main body 90a of the processing chamber. The cathode module may thus be secured in sealing engagement to the main body of the process chamber, but may readily be removed therefrom when access is required to the cathodes.

Two axially aligned circular openings 91 and 91a are formed one in each of the walls 83 and 82 respectively. A shaft housing 92 is secured by bolts such as 93 to the wall 83, the housing being centred in the opening 91 by a boss 94 protruding into the opening. A wear ring 95 extends through the shaft housing and is supported for rotation by a bearing bush 96. A hollow shaft 97 extends through the wear ring 95 and has a further wear ring 98 secured to an axially inner part thereof by a clamp collar 99. A sealing ring 100 is secured between the shaft housing 92 and the wall 83, sealing rings 101 are located between the shaft housing and the wear ring 95, and a sealing ring 102 is located between the wear rings 95 and 98 and around the outer circumference of the hollow shaft 97. A pulley 103 is secured to the shaft 97 externally of the wall 83, and is held in position by locking rings 104 engaging an externally threaded part of the shaft 97. The shaft has an internal bore 105 of circular section, through which extends a further shaft 106, supported for rotation relative to the shaft 97 by bearing bushes 107 and 108. The bearing bush 107 is axially located by a nut 109 engaging the externally threaded section of the shaft 97 and held in place by a locking ring 110. A reduced diameter end section 111 of the shaft 106 extends through the nut 109 and is connected by a flexible coupling 112 to the drive shaft 113 of an electric motor 114. The motor 114 is carried by a mount 115 secured to a base plate 116 supported by brackets 117 welded to the base plate and to the wall 83.

The hollow shaft 97 is formed as an integral extension from a mounting block 120 lying within the casing. The bearing bush 108 fits into a counter bore section 121 of the mounting block and ring seals 122 and 123 are also located in the counter bore, the latter being axially secured by a circlip 124. The inner end of the shaft 106 protrudes above the mounting block 120 and a bevel gear 125 is secured to rotate with that shaft.

The mounting block 120 supports the cathode 74 as will be explained in more detail hereafter, and a similar mounting block 126 supports the cathode 75. The two mounting blocks have confronting flanges 127 and 128 respectively, and similar confronting flanges positioned behind the cathodes into the plane of the paper as seen in FIG. 3. A spacer 129 is located between the flanges, and is positioned and secured by dowels 130 and bolts 131. The spacer supports a bearing bush 132 in which is rotatably mounted a shaft 133 carrying bevel gears 134 and 135 at opposite ends thereof.

The mounting block 126 has an integral shaft extension 136, the end of which carries a wear ring 137 supported within a bearing bush 138 located relative to the wall 82 by a cover 139 secured to the wall by bolts such as 140. It will thus be seen that the assembly of the mounting blocks 120 and 126 with the cathodes 74 and 75 attached thereto is supported in the side walls 83 and 82 by the shafts 97 and 136 respectively for pivotal movement about the axis AA. Such pivotal movement can be effected by imparting angular movement to the pulley 103, for example by way of a toothed belt drive from a stepping motor. Alternatively, the pulley may be replaced by a hand-operated lever movable between preselected detent positions.

The construction of the cathode 75 will now be described in more detail with particular reference to FIG. 3B, it being understood that cathode 74 is substantially identical in construction except that it is of opposite hand. The cathode 75 comprises a central hollow sleeve 150 on which is mounted a magnet assembly 151. The magnet assembly may take any of the forms described in the aforesaid McKelvy U.S. Pat. No. 4,422,916 and need not here be described further. Suffice it to say that the magnet assembly will define a sputtering zone that extends lengthwise of the cathode and faces into the space between the two cathodes. The upper end of the sleeve 150 is formed with an externally threaded section 152 onto which are threaded locking rings 153 and 154. Two halves of a split insulating bush 155 are captive between the locking rings, and the two parts of the bush receive between them a keep plate 156 secured to the mounting head 126 by bolts such as 157. The sleeve 150 is accordingly supported by the keep plate 156 from the mounting head 126.

The sleeve 150 and magnet 151 lie radially within a cylindrical target tube 160, the outer surface of which is coated with target material 161, and the lower end of which is closed by an end plate 162. The target tube 160 is secured at its upper end to a head piece 163 by a securing ring 164 engaging a screw threaded section of the head piece 163. A sealing ring 165 is located between the upper end of the target tube and the head piece. The head piece is radially spaced from the sleeve 150 by insulating bushes 166 and is sealed relative to the sleeve 150 by sealing rings 167 which are also of insulating material. A bevel gear ring 168 seats on a gear seating ring 169 of insulating material and is secured to the head piece 163 by bolts such as 170 encased in insulating bushes. Further insulating bushes 171 and 172 radially space the head piece 163 from a circular bore in the mounting block 126, and the bush 171 provides an upwardly facing surface 173 on which the gear ring 168 is supported for rotation about the axis of the cathode. Such rotation is effected by drive from the bevel gear 135, which in turn is driven by shaft 133 from bevel gear 134. That rotation is effected by rotation of the bevel gear ring 174 of the other cathode 74, which in turn is driven through bevel gear 125 and shaft 106 from the motor 114. Thus, drive motor 114 will cause simultaneous rotation of the target tubes of both cathodes about their respective axes.

An inlet tube 180 for cooling water extends downwardly through the sleeve 150 from an inlet hose coupling 181 at the top of the sleeve to a plug 182 at the bottom of the sleeve. Cooling water can thus circulate down the inlet tube 180 and then upwardly within the target tube 160 to leave this through radial bores 183 extending through the sleeve 150 into the central space thereof. That central space communicates with a water outlet hose connector 184 at the top of the sleeve. Flexible hoses 185 and 186 join the connectors 181 and 184 respectively to water inlets and outlets 187 and 188 carried by a cap 189 secured by bolts to the wall 83. A similar cap 190 secured to the wall 82 carries water inlet and outlet connectors which are joined by flexible hoses to respective water inlet and outlets associated with the cathode 74, these elements having been omitted from the drawing for the sake of clarity.

The rear wall 81 of the housing is formed with two bushings, the locations of which are shown at 200 and 201 on FIG. 3B. Bushing 201 is shown in more detail in FIG. 4 and forms a support for a connector 202 for a source of electrical power, the connector being connected by a flexible cable 203 to a housing 204 for a brush unit 205. The brushes of the brush unit extend into contact with the outer surface of the head piece 163 through a break in the insulating sleeve 172, so that electrical power may be supplied to the head piece and thus to the target tube 160.

Cathode 75 also includes one or more dark space screens 210, each secured by screws such as 211 to a dark space screen holder 212 which shields an arc of approximately 270° of the target tube. The unshielded arc is, of course, in the region of the sputtering zone determined by the magnet assembly. The dark space screen 212 has an end cap 213 and a square upper end plate 214 secured at each corner by a bolt such as 215 to the mounting head 126.

When a disc is to be coated the locking members such as 19 are released and the loading assembly 2 is pivoted on its hinges to the open position shown in broken lines in FIG. 2. The center of the disc is then engaged onto the disc holder 43 at the end of the shaft 42 and is secured in position by a locking ring 220, so mounting the disc at the loading position shown as DL in FIG. 2. The shutter valves 5 and 8 are closed and the loading assembly is then swung to the closed position shown in solid lines in FIG. 2, so positioning the disc at the disc retracted position DR, i.e. located within the loading chamber 3. The locking members such as 19 are secured, the shutter valve 5 is opened, and the chamber 3 is then evacuated through the vacuum system 4. After evacuation, the disc can be cleaned by any suitable means provided in the loading chamber, for example means causing glow discharge, DC sputter etching or RF sputter etching. After cleaning of the disc, the shutter valve 8 is opened and the hand wheel 27 is turned so that shaft 26 rotates and carriage 23 is driven towards the loading chamber, so moving the disc to its advanced position DA, and causing the dog tooth members 41 and 44 to engage, so that the disc may be rotated by drive from the motor 37. During the advancing movement of the disc the cathodes 74 and 75 are in their vertical withdrawn positions shown in FIG. 1 and in solid lines in FIG. 4 so that movement of the disc into the process chamber is not impeded. When the disc is in the advanced position a rotary movement is applied to the pulley 103 so pivoting the cathodes to their operating position shown in FIG. 2 and in broken lines in FIG. 4, wherein one cathode lies to each side of the disc, with the sputter zones of the cathodes facing opposite disc surfaces. The processing chamber is evacuated both by the vacuum system 4 and the vacuum system 7, gas as required is supplied through line 72, cooling water is caused to flow through the cathodes, and cathode potential sufficient to cause sputtering to occur is applied to the target tubes from either a DC or an RF power source (not shown) through the respective brush assemblies 205. The apparatus is grounded in any suitable manner. During the sputtering process the disc is rotated so that the whole of both surfaces thereof is coated, apart of course from the center region where the disc is supported.

When a sufficient thickness of coating material has been deposited, power is removed from the cathodes and they are retracted back to their withdrawn vertical positions. The disc is withdrawn to the retracted position DR, shutter valves 8 and 5 are closed and the loading assembly 2 is opened so that the coated disc can be removed. The sputtering zones of the cathodes may be such that discs of a wide range of diameters may be successfully and evenly coated with the cathodes held in a single pivoted position. However, if discs of larger diameter are to be treated it is possible to combine rotation of the disc with pivotal oscillation of the cathodes in order to ensure that all parts of both disc surfaces are coated.

During the coating process the target tubes may be rotated continuously by operation of the motor 114 so that target material wears substantially uniformly from the whole of the surfaces of the target tubes. Alternatively, one area of the target tubes may be exhausted, and the tubes then moved through a given angular displacement in order to bring a fresh section of target material into the sputtering zone. In yet another variation of the process the target tubes may have distinct lengthwise extending bands thereof coated with different sputtering materials. By appropriate rotation of the target tubes, therefore, different materials may sequentially be coated onto the discs, without having to remove the discs from the processing chamber and without having to change target tubes.

FIGS. 5 to 8 illustrate parts of a form of the apparatus capable of use for coating of discs on a production line basis. The apparatus is designed in modular fashion and in the example shown it comprises a loading/unloading module 301, two process modules 302, 303 respectively and a turn round module 304. Each module is supported from the floor by respective stand means 305 to 308 respectively. Each module has a flange 309 at each end thereof and adjacent modules are secured together by bolts (not shown) extending through the respective flanges, with sealing means being provided between the flanges. The free end of the loading/unloading module is closed by an end plate 310 and the free end of the turn round module is closed by an end plate 311, each end plate being bolted to the respective flange and again provided with sealing means between the end plate and the flange. The sealing means are designed to be such that the whole of the interior of the modules may be evacuated. Each of the process modules 302, 303 incorporates two processing stations 312, 313 and 314, 315 respectively. It will be appreciated that additional process modules may be incorporated between loading/unloading module 303 and the turn round module 304 as required. Part of the loading/unloading module is located in a clean room; this is not necessary for the remainder of the apparatus which may therefore lie behind a wall 316 of the clean room, so reducing the required clean room area.

Figure 5:
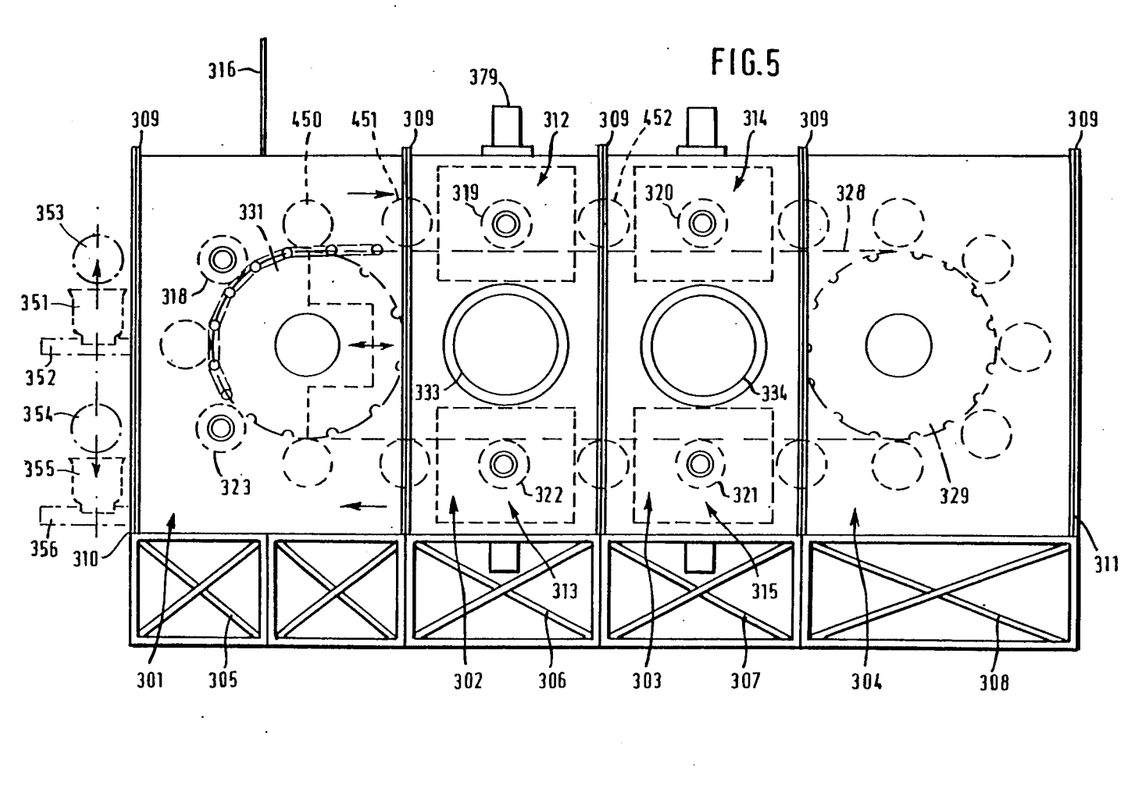
FIG. 5 is a somewhat schematic side elevation of a second form of apparatus, for use in a production line process.

The modules house a plurality of carriage units such as 317, the carriage units being capable of movement around a closed loop track in the direction shown by the arrows in FIG. 5. During such movement the carriage units will pass through a loading position 318, four processing positions 319 to 322 and an unloading position 323. Each carriage unit includes a carriage plate 324 (FIGS. 7 and 8) secured by pivot spindles 325, 326 to adjacent linking plates 327, 328. The train of plates is driven round the closed path by a drive sprocket 329 in the turn round module 304, the sprocket engaging the pivot spindles. The turn round module incorporates an externally mounted motor 330 and a suitable transmission (not shown) for transmitting drive through a sealed entry into the chamber from the motor to the drive sprocket 329. The motor is operated so that drive is in stepwise fashion, each carriage unit 317 being advanced sequentially through each of the locations shown in broken lines in FIG. 6, with an appropriate dwell time at each location. The loading/unloading module 301 incorporates a chordal adjustment cam 331 which can be adjusted as shown by the double-ended arrow to tension the train of plates.

Figure 6:
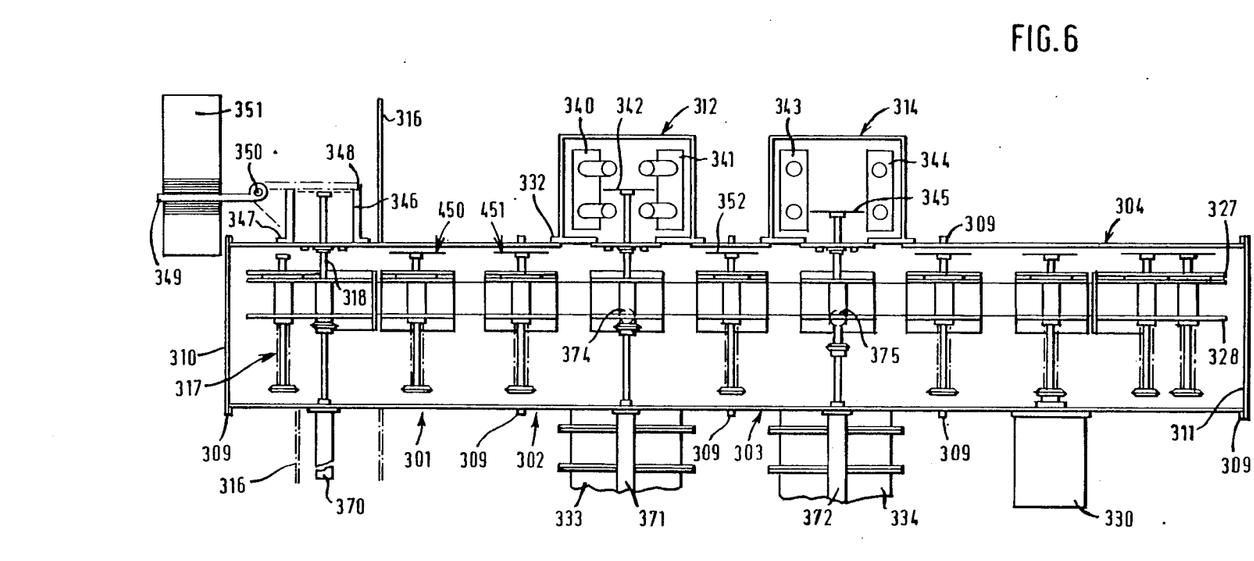
FIG. 6 is a somewhat schematic plan view of the apparatus of FIG. 5.

Each of the processing stations 312 to 315 comprises a chamber having a flange 332 secured to one side wall of the main body of the process chamber by bolts (not shown), with appropriate sealing means being located between the flange and the side wall. Thus, chambers 312 and 313 are located one above the other on one side wall of the process module 302, while chambers 314 and 315 are located one above the other on the side wall of process module 303. The opposite side walls of the process modules 302 and 303 each have mounted thereon an outlet arrangement 333, 334 respectively to a vacuum pump system, by way of which the whole of the interior of the modular assemby may be evacuated. Each process chamber 312 to 315 includes two cathode assemblies, each substantially as described with reference to FIGS. 3 to 5, and each capable of pivotal movement between withdrawn positions lying one to each side of a disc path into the respective process chamber, and operating positions wherein the cathodes of each assembly lie on respective sides of a disc located in the coating position. For illustrative purposes only FIG. 6 shows a disc 342 in its coating position in chamber 312 with the cathode assemblies 340 and 341 in their operating positions, while chamber 314 is shown with cathode assemblies 343 and 344 in their withdrawn positions and with a disc 345 in an intermediate position between its coating and transport positions. Each process chamber is provided with its own supply of cooling water, of electrical power and of gas. If required, each chamber may have its own individual vacuum pump, rather than rely wholly on the pump systems connected to chamber outlets 333, 334. Such connections will be apparent to those skilled in the art.

The loading station comprises a loading chamber 346 having an inner end surrounded by a flange 347 by way of which the chamber is bolted to a side wall of the loading/unloading module, appropriate sealing means being incorporated between the flange and the side wall. The outer end of the loading chamber is open and is provided with sealing means 348 extending around the periphery thereof. A loading mechanism includes a carrier 349 mounted about a pivot axis 350 between a pick up position shown in solid lines in FIG. 6 and a release position shown in broken lines in that Figure. In the release position the carrier 349 closes the outer end of the chamber 346, a seal being effected between the carrier and the chamber by the sealing means 348. The carrier 349 is positioned above the path of a cassette-type disc holder 351, which may be advanced in stepwise fashion along a track 352. After each advance an individual disc 353 may be raised from the holder 351 by any suitable mechanism well known in the art and, after raising may be held by the carrier 349 engaging parts of the disc circumference, again in well known manner. When so held the disc may be pivoted to the loading position and transferred to that carriage unit 318 which is currently positioned at the loading station, as will further be described hereinafter.

The unloading station is in many respects similar to the loading station, incorporating an open ended chamber secured by a flange to the side wall of the loading-/unloading module, and having an unloading carrier similar to the loading carrier 349. Discs 354 unloaded thereby as shown in FIG. 6 may then be lowered into a cassette holder for coated discs, that holder being advanced along a track 356. Thus, uncoated discs advance to the apparatus in a cassette along track 352, while coated discs leave the apparatus in a cassette along track 356.

It will be appreciated that at the loading station 318 a disc needs to be moved from the loading position to the transport position, at each processing station 312 to 315 a disc needs to be moved from the transport position to the coating position and then back to the transport position, and at the unloading station 323 a disc needs to be moved from the transport position to the unloading position. The mechanism for achieving this will now be described.

The loading, processing and unloading stations each have a double acting pneumatic or hydraulic ram associated therewith, those shown in the drawings being ram 370 for the loading station, rams 371 and 372 for processing stations 312 and 314 and ram 373 for processing station 321. Additionally, each of the processing stations has a bevel drive wheel associated therewith, those shown in the drawings being bevel gears 374, 375 and 376 for stations 312, 314 and 315 respectively. Each bevel gear (and only gear 374 is described by way of example) is mounted on a shaft 377 journalled in a sealed bearing housing 378 secured to either the upper or lower wall of the respective module. The wall also supports an electric motor 379 by way of which the bevel gear may be rotated.

All the carriage units 317 are identical and by way of example the unit in the processing position 319, cooperating with process chamber 312 will now be described in detail to facilitate an understanding of these units, the description being given with reference to FIGS. 7 and 8. When the carriage unit has been moved into the required processing position 319 the motor 330 is stopped, in a position wherein the unit 317 is coaxial with the axis of the chamber 312, and with the axis of the ram 371. The piston rod of the ram 373 projects into the chamber through a seal 380 in the side wall of the module 303, and the piston rod carries a bearing 381 at the end thereof.

Each carriage plate 324 has a body 381 with a tubular bore 382 through which a sleeve 383 extends. A ring bevel gear 384 is secured to the sleeve adjacent one end thereof, by a pin and slot or a spline arrangement so that the gear can move axially in the sleeve but is constrained to rotate therewith. This end of the sleeve engages an end piece 385, a compression spring 386 being located between the end piece 385 and the ring gear 384 in order to bias this towards engagement with the bevel gear 374. The end piece 385 has an outwardly directed flange 387, and a further compression spring 388 extends between this flange and an end plate 389. The end plate 389 has a recess 390 in which the end of the piston rod 371 can be accommodated, and has an annular section 391 surrounding the recess and capable of engaging the bearing 381 so that rotation of the end plate 389 relative to the piston rod of ram 371 is permitted.

A rod 400 is secured by a nut 401 to the end plate 389 and extends throughout the length of the sleeve 383. The rod is free to slide axially within the sleeve 383, but is constrained to rotate therewith by way of a pin 402 engaged in an axial slot 403. At the end remote from the gear 384 the sleeve 382 has an annular plate 404 secured thereto by bolts such as 405. One end of a corrugated expandable seal 406 is secured to the plate 404, and the other end of the seal is secured to an annular member 407, the inner diameter of which is secured and sealed at 408 to the rod 400. A sleeve 409 projects from the annular member 407 into an enlarged section 409 of the bore through sleeve 383. The free end of rod 400 has a disc holder, 410, for example a spring chuck capable of expanding into and gripping a hole in the center of the disc.

The annular plate 404 locates a bearing 420 against a shoulder 421 of the sleeve 383. The bearing enables the sleeve 383 to rotate relative to a surrounding collar 422 which is axialy located relative to the bearing by a bush 423 secured by bolts such as 424. The collar 422 has an annular plate 425 secured thereto by bolts such as 426, the plate having an axially projecting flange 427 circumferentially surrounded by a sealing ring 428. Additional sealing rings are provided at 429 between the plate 425 and collar 422, at 430 between the collar 422 and plate 404 and at 431 between the plate 404 and the sleeve 383. The collar 422 has a guide rod 432 threaded thereto, the rod being slidably movable through a guide hole in a guide member 433 secured by bolts 434 to the body 381. A tension spring 435 extends between the collar 422 and a lug 436 fixed to the body 381.

Figure 7:
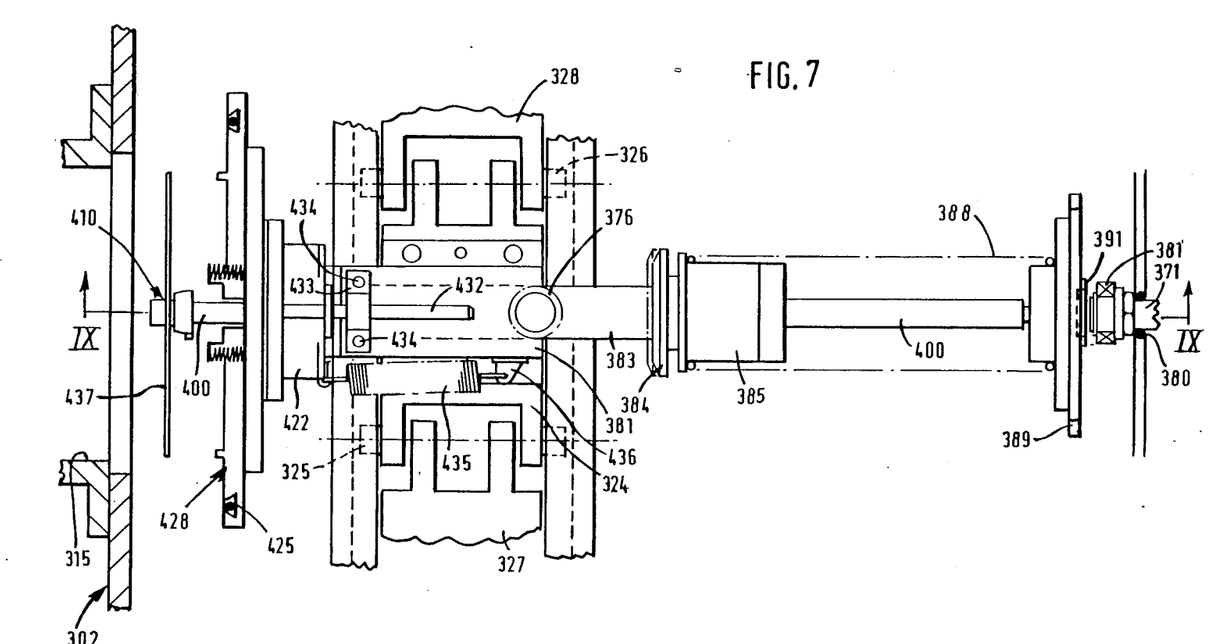
FIG. 7 is an enlarged plan view of part of the apparatus shown in FIG. 6.
Figure 8:
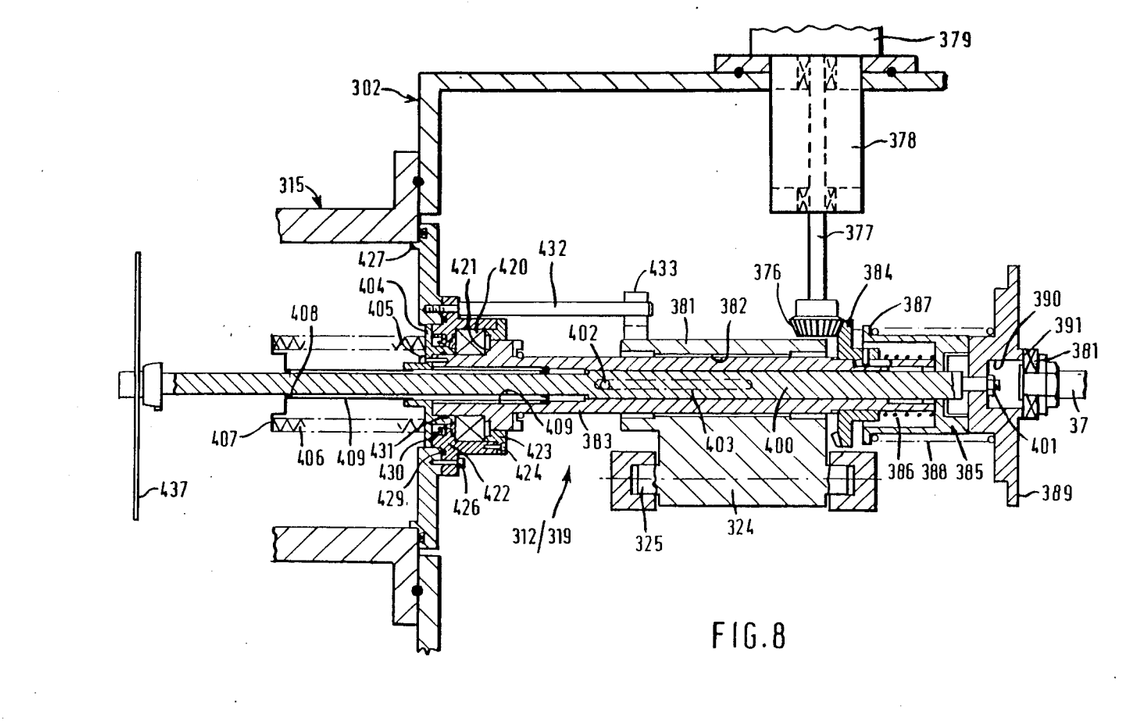
FIG. 8 is a partial cross-section on the line IX—IX of FIG. 7.

The apparatus is shown in the transport position in FIG. 7, and in the working position in FIG. 8. In the transport position the ram 373 is retracted, compression springs 386 and 388 are extended and tension spring 435 is retracted. Accordingly, ring bevel gear 484 lies out of engagement with bevel gear 374, the plate 425 is spaced from the chamber 312 and a disc 437 carried by the rod 400 also lies outside the chamber. The seal 406 is compressed. In order to move the disc into the chamber the ram 371 is extended, whereupon the bearing 381 contacts end plate 389. The assembly of the plate 389, rod 400, spring 388, end piece 385 and sleeve 383 is then driven to the left as shown in FIGS. 7 and 8 until the ring gear 384 engages the bevel gear 374 and the plate 425 engages the periphery of the process chamber 312, the seal 428 effecting a seal around the chamber. During this movement the collar 422 and associated assembly will have been guided relative to the body 381 by the guide rod 432 and the tension spring 435 will have been extended.

Further extension of the ram 371 then causes further compression of the spring 388 while axially moving rod 400 through the bore in the sleeve 383, so advancing the disc 437 to its working position within the chamber. At the same time the seal 406 is extended, and this, together with the seal 428 seals the interior of process chamber 312 from the remainder of the apparatus. When in this position, rotary drive transmitted through bevel gear 374 to the ring gear 384 will cause rotation of the sleeve 383 within the bearing 421, the rotation being transmitted to the rod 400, disc 437, seal 406 and annular plate 404 and also to the end plate 389, which is permitted to rotate relative to the piston rod of ram 373 by the bearing 381.

When the disc is to be withdrawn from the processing chamber back to the transport position, the ram 371 is retracted whereupon the springs 386, 388 and 435 return to their original conditions, so returning the parts to the positions shown in FIG. 7 with the disc 437 removed from the chamber and the drive from bevel gear 374 to ring gear 383 disengaged.

Overall operation of the apparatus will now be apparent. Describing this briefly from a start up condition a first disc to be coated is presented to the loading chamber 346 after the rod 400 of the disc holder at that station has been moved into the loading chamber by extension of ram 370. The disc is mounted on the end of the rod 400 and while the loading chamber remains sealed by engagement of the plate 349 with the outer end of the chamber and by engagement of the seal 428 of plate 425 of the disc holder around the inner end of the chamber, the chamber is evacuated. The ram 370 is then retracted to move the disc to the transport position and the motor 330 is operated to step the disc on to the next transport location 450. At that time the subsequent carriage unit will be present opposite the loading chamber 346 and after the ram 370 has been extended so that the plate 425 of that unit seals the loading chamber 346 the plate 349 can be moved to receive a further disc for presentation to the loading chamber. With the further disc loaded, the ram 370 is retracted and the motor caused to step the apparatus onto the next location, the first loaded disc thus moving to location 451, and the second loaded disc to location 450. The loading cycle is repeated as aforesaid, after which time the first disc is at location 319 ready for entry into the first process chamber 312.

Simultaneously with the loading of a further disc as described, the ram 371 is extended to move the first disc into the process chamber 312 and engage the rotary drive for the disc from bevel gear 374. Once the disc is in the coating position the cathodes 340, 341 are moved to their operating positions and the required operation is carried out. Typically, in the first process chamber 312 this may be a sputter etch process in order to clean the disc. Following that operation the cathodes are withdrawn, the ram 371 is retracted, and the disc is thus moved back to the transport position. By this time, the simultaneous loading operation of the next disc will have been completed. A further stepping movement of the conveyor system then occurs, after which a further disc is loaded and the second loaded disc is moved into the process chamber 312, the first loaded disc moving to location 452. After a further stepping movement it will be seen that the first loaded disc is aligned with process chamber 314, into which it may be advanced by extension of ram 372, the disc being rotated, when in the chamber, from bevel gear 375. In chamber 314, typically, a graphite coating may be sputtered onto the disc after the cathodes 343, 344 in that chamber have been moved from their withdrawn to their operating positions. After further stepping movements of the conveyor, subsequent discs are loaded and moved through the processing chambers 312 and 314. After several more such movements, the first loaded disc will pass sequentially through the process chambers 315 and 313 where further coatings may be applied and will eventually be presented at the unloading station 323 where an unloading operation analogous to the loading operation takes place.

It will be evident that the apparatus provided is capable of handling discs of different diameters, and of independent process control at each of the processing stations to which the disc is presented. The apparatus is relatively compact and once loaded, the disc is supported only in its center region, so that coating of the disc surfaces can be very uniform. The apparatus is capable of high throughput, the limiting factor principally being that of the speed of operation of the load and unload mechanisms.

It will be understood that within the broad outline of the apparatus there are many variations and changes that will be apparent to those skilled in the art, and it will be understood that such changes and modifications may be made without departing from the spirit and scope of the claims.

I claim:

1. Apparatus for sputter coating a substrate in the form of a disc, comprising an evacuable chamber having a disc entry and an exit opening, support means for supporting said disc at the center thereof, drive means for driving said support means to move said disc along a disc path between a disc loading position outside said chamber and a disc coating position within said chamber, a pair of cathodes each having coating material to be sputtered applied to a surface thereof, pivot means mounting said cathodes within said chamber for pivotal movement between withdrawn positions lying clear of said disc path and operating positions wherein said cathodes lie one to each side of said disc when in said coating position, and rotary means for rotating said disc about the center thereof when in said coating position, whereby coating material is sputtered simultaneously onto both sides of said disc as said disc is rotated in said coating position with said cathodes in said operating positions.

2. Apparatus according to claim 1 in which said cathodes are magnetically enhanced.

3. Apparatus according to claim 2 in which said cathodes are cylindrical cathodes parallel one to the other, and said pivot means mounts said cathodes about a common pivot axis extending perpendicular to the axes of said cathodes.

4. Apparatus according to claim 1 in which each said cathode comprises a cylindrical tubular member having said coating material applied as a layer to the outer surface thereof, magnetic means located in said tubular member for providing a sputtering zone extending lengthwise thereof and facing towards said disc coating position when said cathode is in its operating position, and means for rotating said tubular member about its longitudinal axis when said cathode is in its operating position to bring different portions of said coating material into sputtering position opposite said magnetic means and within said sputtering zone.

5. Apparatus according to claim 4 in which, for each of said cathodes, said means for rotating said tubular member about its longitudinal axis comprises a ring gear secured around the upper end of said tubular member, a pinion in engagement with said ring gear, a shaft on which said pinion is mounted and means for rotating said shaft, said shaft being coaxial with the pivot axis of said cathode.

6. Apparatus according to claim 5 in which said tubular members of said two cathodes are parallel one to the other, said pivot means mounts said cathodes about a common pivot axis extending perpendicular to the axes of the cathodes, and one of said cathodes has a second pinion in engagement with said ring gear thereof, said second pinion being secured at one end of said shaft associated with the other of said cathodes, said pinion of the other of said cathodes being mounted at the opposite end of said shaft to which said second pinion is secured.

7. Apparatus according to claim 6 and including a bearing for said shaft to which said second pinion is secured, a support for said bearing, and means securing said support to each of said cathodes to tie these together for common pivotal movement.

8. Apparatus according to claim 1 in which said support means includes a disc support rod, means are provided for axially moving the rod to move said disc between said disc loading and said disc coating positions, and said rotary means for rotating said disc comprises a drive element and clutch means coupling said drive element to rotate said rod when in the disc coating position and uncoupling said drive element from said rod when in the disc loading position.

9. Apparatus according to claim 8 and including a drive motor located outside said chamber, and transmission means coupling said motor to drive said drive element.

10. Apparatus according to claim 9 in which said transmission means extends through a sealed opening into the chamber.

* * * * *